United States Patent
Konyuba

(10) Patent No.: US 9,613,780 B2
(45) Date of Patent: Apr. 4, 2017

(54) METHOD OF FABRICATING SAMPLE SUPPORT MEMBRANE

(71) Applicant: JEOL Ltd., Tokyo (JP)

(72) Inventor: Yuji Konyuba, Tokyo (JP)

(73) Assignee: JEOL Ltd., Tokyo (JP)

( * ) Notice: Subject to any disclaimer, the term of this patent is extended or adjusted under 35 U.S.C. 154(b) by 0 days.

(21) Appl. No.: 14/657,059

(22) Filed: Mar. 13, 2015

(65) Prior Publication Data

US 2015/0259785 A1 Sep. 17, 2015

(30) Foreign Application Priority Data

Mar. 14, 2014 (JP) .................................. 2014-51352

(51) Int. Cl.
*H01J 37/20* (2006.01)
*C23C 14/14* (2006.01)

(52) U.S. Cl.
CPC .............. *H01J 37/20* (2013.01); *C23C 14/14* (2013.01); *H01J 2237/20* (2013.01)

(58) Field of Classification Search
CPC ......... C23C 14/14; C23C 14/34; C23C 14/48; C23C 16/44
See application file for complete search history.

(56) References Cited

U.S. PATENT DOCUMENTS

| 6,211,527 B1 * | 4/2001 | Chandler | H01J 37/3056 250/492.2 |
| 2004/0043615 A1 * | 3/2004 | Yamamoto | H01L 21/76898 438/689 |
| 2005/0098840 A1 * | 5/2005 | Fuertsch | B81B 3/007 257/414 |
| 2006/0243655 A1 * | 11/2006 | Striemer | B01D 67/0062 210/490 |

FOREIGN PATENT DOCUMENTS

| JP | 2009517685 A | 4/2009 |
| WO | 2007126165 A1 | 11/2007 |

* cited by examiner

*Primary Examiner* — Duy Deo
(74) *Attorney, Agent, or Firm* — The Webb Law Firm

(57) ABSTRACT

A method of fabricating a sample support membrane used to support an electron microscope sample starts with forming a first layer on a first layer of a substrate (S100). A second surface of the substrate that faces away from the first surface is etched to form an opening that exposes the first layer (S102). A second layer is formed on the first layer (S104). The region of the first layer that overlaps the opening as viewed within a plane is removed to expose the second layer (S106).

15 Claims, 17 Drawing Sheets

METHOD OF FABRICATING SAMPLE SUPPORT MEMBRANE

BACKGROUND OF THE INVENTION

Field of the Invention

The present invention relates to a method of fabricating a sample support membrane.

Description of Related Art

Sample support membranes used in transmission electron microscopy (TEM) and other similar applications are made of carbon film, silicon nitride film (SiN), and Formvar (polyvinyl formal resin). Preferably, sample support membranes satisfy various conditions including electron beam transmittance, ease of manufacturability, invulnerability to electron beam irradiation, and surface smoothness. A related art method of fabricating a sample support membrane is described below.

Where a carbon film is used as a sample support membrane, it can be fabricated by depositing carbon on a cleavage face of mica or rock salt using a vacuum evaporator, peeling off the evaporated carbon film on a water surface, and scooping the water using a finely apertured mesh or a microgrid.

Where a sample support membrane is made of Formvar, a clean slide glass or a cleavage face of mica is first set on equipment for fabricating a Formvar membrane. The slide glass is immersed in dissolved Formvar, forming a membrane on the slide glass. Then, in order to peel off the membrane from the slide glass surface, a cut is formed in the surface of the membrane with a razor. The slide glass is slowly sunk in the liquid at an angle of about 10 degrees to the water surface while holding one end of the slide glass with one hand. Consequently, water enters between the membrane and the glass, peeling off the membrane. The membrane floats on the water surface. The membrane is scooped with a mesh or microgrid, thus fabricating a sample support membrane.

JP-A-2009-517685 discloses a method of fabricating an ultrathin carbon support membrane for high-resolution TEM analysis, the method involving four phases. The first phase consists of placing a clean, hydrophobic slide glass on an ice pack located in a cooled refrigerator or freezer, picking up the slide glass with tweezers, and exposing the glass to the atmosphere to form liquid droplets. The second phase consists of dissolving Formvar in chloroform solvent to form a solution, immersing the slide glass having the liquid droplets thereon in the solution, picking up the glass out of the solution after several seconds, applying moisture absorbing paper to the bottom, and placing the glass vertically within the atmosphere to dry the glass. The third phase consists of setting the polymer film formed on the slide glass afloat on the surface of distilled water using the surface tension of the distilled water and placing a Cu grid being one type of metal mesh grid on the polymer film that has been placed on the surface of the distilled water. The fourth phase consists of taking out the polymer film from the distilled water using a hydrophobic support stage such as paraffin film, then placing the polymer film in a higher position, and coating the film with carbon.

In the above-described method of fabricating a sample support membrane, the membrane is formed using peeling at a water surface. However, this peeling must be done manually. Furthermore, if peeling is done at a water surface or when the membrane is placed on a mesh, the membrane might be destroyed. In this way, with the method of fabricating a sample support membrane using peeling at a water surface, it is not easy to fabricate a sample support membrane.

SUMMARY OF THE INVENTION

In view of the foregoing problems, the present invention has been made. One object associated with some aspects of the invention is to offer a method capable of fabricating a sample support membrane easily.

(1) A method associated with the present invention to fabricate a sample support membrane is adapted to support an electron microscope sample and comprises the steps of: forming a first layer on a first surface of a substrate; etching a second surface of the substrate that faces away from the first surface to form an opening which exposes the first layer; forming a second layer on the first layer; and removing a region of the first layer that overlaps the opening as viewed within a plane to expose the second layer.

In this method of fabricating a sample support membrane, a sample support membrane can be easily fabricated.

(2) In one feature of this method of fabricating a sample support membrane, during the step of forming the second layer, the second layer may be formed by vacuum evaporation, sputtering, ion plating, or CVD.

In this method of fabricating a sample support membrane, it is easy to control the thickness of the second layer. A sample support membrane of a desired thickness can be easily formed. Furthermore, in this method, a cleaner membrane can be fabricated, for example, as compared to the case where peeling at a water surface is employed because a less amount of foreign matter is introduced.

(3) In another feature of this method of fabricating a sample support membrane, there may be further provided the step of forming a conductive layer on a region of the second layer that has been exposed by the step of exposing the second layer.

In this method of fabricating a sample support membrane, the conductive layer can suppress the second layer from being charged up.

(4) In a further feature of this method of fabricating a sample support membrane, there may be further provided the steps of:

forming a third layer on the second layer; and removing a region of the second layer that overlaps the opening as viewed within a plane to expose the third layer.

In this method of fabricating a sample support membrane, a membrane material forming the sample support membrane can be selected from a wider range of choices.

(5) In a yet other feature of the first-mentioned method associated with the present invention to fabricate a sample support membrane, the first layer may be made of silicon nitride.

In this method of fabricating a sample support membrane, the first layer is made of silicon nitride and so the first layer can be fabricated as a thin and uniform film on the substrate. Furthermore, even if an opening is formed, the first layer neither deforms nor becomes torn; rather the shape can be maintained.

(6) In a still other feature of the first-mentioned method associated with the present invention to fabricate a sample support membrane, the second layer may be made of chromium, IGZO, or tantalum.

In this method of fabricating a sample support membrane, in a case where the first layer is made of silicon nitride, if the second layer is made of chromium, IGZO, or tantalum, the first layer can be selectively removed during the step of removing the first layer.

(7) In a still further feature of the first-mentioned method associated with the present invention to fabricate a sample support membrane, the substrate may be a silicon substrate.

In this method of fabricating a sample support membrane, a sample support membrane can be easily fabricated using a semiconductor fabrication technique.

(8) In an additional feature of this method of fabricating a sample support membrane, during the step of forming the third layer, the third layer may be formed by vacuum evaporation, sputtering, ion plating, or CVD.

In this method of fabricating a sample support membrane, the thickness of the third layer can be easily controlled and, therefore, a sample support membrane of a desired thickness can be easily formed. Furthermore, in this method, a cleaner membrane can be fabricated, for example, as compared to the case where peeling at a water surface is employed because a less amount of foreign matter is introduced.

(9) Another method associated with the present invention is adapted to fabricate a sample support membrane used to support an electron microscope sample. This method includes the steps of: forming a first layer on a first surface of a substrate; forming a second layer on the first layer; and etching the first layer and a second surface of the substrate that faces away from the first surface to form an opening which exposes the second layer.

In this method of fabricating a sample support membrane, a sample support membrane can be easily fabricated.

(10) In one feature of this method of fabricating a sample support membrane, during the step of forming the second layer, the second layer may be formed by vacuum evaporation, sputtering, ion plating, or CVD.

In this method of fabricating a sample support membrane, the thickness of the third layer can be easily controlled and, therefore, a sample support membrane of a desired thickness can be easily formed. Furthermore, in this method, a cleaner membrane can be fabricated, for example, as compared to the case where peeling at a water surface is employed because a less amount of foreign matter is introduced.

(11) In another feature of this method of fabricating a sample support membrane, there may be further provided the step of forming a conductive layer on a region of the second layer that has been exposed by the step of forming the opening.

In this method of fabricating a sample support membrane, the conductive layer can suppress the second layer from being charged up.

(12) In a further feature of this method of fabricating a sample support membrane, there may be further provided the steps of: forming a third layer on the second layer; and removing a region of the second layer that overlaps the opening as viewed within a plane to expose the third layer.

In this method of fabricating a sample support membrane, a membrane material forming the sample support membrane can be selected from a wider range of choices.

(13) In one feature of this method of fabricating a sample support membrane, during the step of forming the third layer, the third layer may be formed by vacuum evaporation, sputtering, ion plating, or CVD.

In this method of fabricating a sample support membrane, it is easy to control the thickness of the third layer. A sample support membrane of a desired thickness can be easily formed. Furthermore, in this method, a cleaner membrane can be fabricated, for example, as compared to the case where peeling at a water surface is employed because a less amount of foreign matter is introduced.

(14) A further method associated with the present invention is adapted to fabricate a sample support membrane used to support an electron microscope sample. This method includes the steps of: forming a recess in a first surface of a substrate; forming a first layer on a second surface of the substrate that faces away from the first surface; and etching a bottom surface of the recess to form an opening that exposes the first layer.

In this method of fabricating a sample support membrane, a sample support membrane can be easily fabricated.

(15) In this method associated with the present invention to fabricate a sample support membrane, during the step of forming the first layer, the first layer may be formed by vacuum evaporation, sputtering, ion plating, or CVD.

In this method of fabricating a sample support membrane, it is easy to control the thickness of the first layer. A sample support membrane of a desired thickness can be easily formed. Furthermore, in this method, a cleaner membrane can be fabricated, for example, as compared to the case where peeling at a water surface is employed because a less amount of foreign matter is introduced.

(16) In one feature of this method of fabricating a sample support membrane, during the step of forming the opening, the etching of the bottom surface of the recess may be carried out by dry etching using XeF2 gas.

In this method of fabricating a sample support membrane, the etching of the bottom surface of the recess is carried out by dry etching using XeF2 gas and, therefore, a cleaner membrane can be obtained, for example, as compared to the case where the bottom surface of the recess is wet etched.

(17) In a further feature of this method of fabricating a sample support membrane, there may be further provided the step of forming a conductive layer on a region of the first layer that has been exposed by the step of forming the opening.

In this method of fabricating a sample support membrane, the conductive layer can suppress the first layer from being charged up, because the conductive layer is formed on the first layer.

BRIEF DESCRIPTION OF THE DRAWING(S)

FIG. 1 is a flowchart illustrating one example of a method associated with a first embodiment of the present invention to fabricate a sample support membrane.

FIGS. 2-5, 7, and 8 are schematic cross-sectional views illustrating steps of fabricating a sample support membrane in accordance with the first embodiment.

DESCRIPTION OF THE INVENTION

The preferred embodiments of the present invention are hereinafter described in detail with reference to the drawings. It is to be understood that the embodiments provided below do not unduly restrict the scope and content of the present invention delineated by the appended claims and that not all the configurations described below are essential constituent components of the invention.

1. First Embodiment

Figure 1:
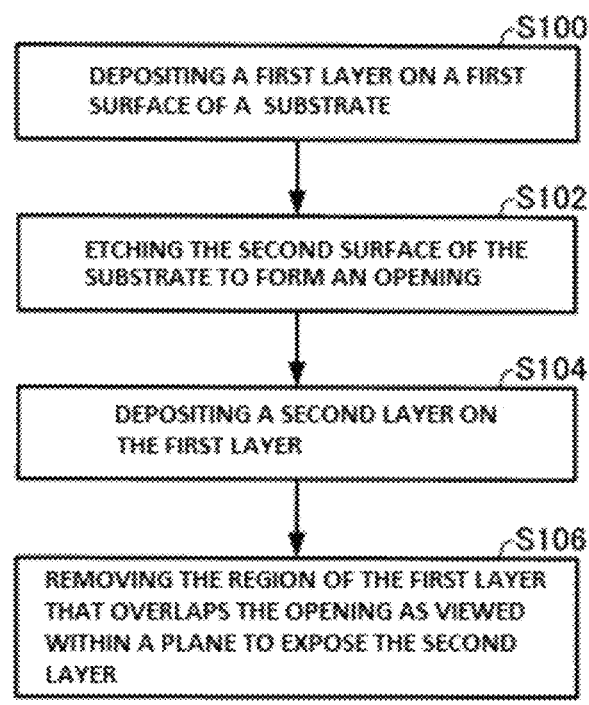
Figure 4:
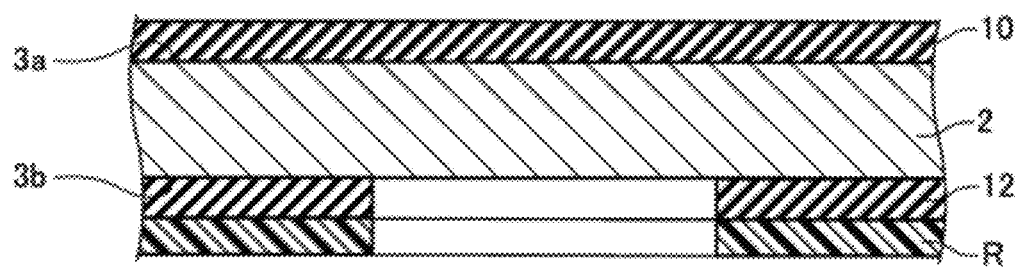
Figure 5:
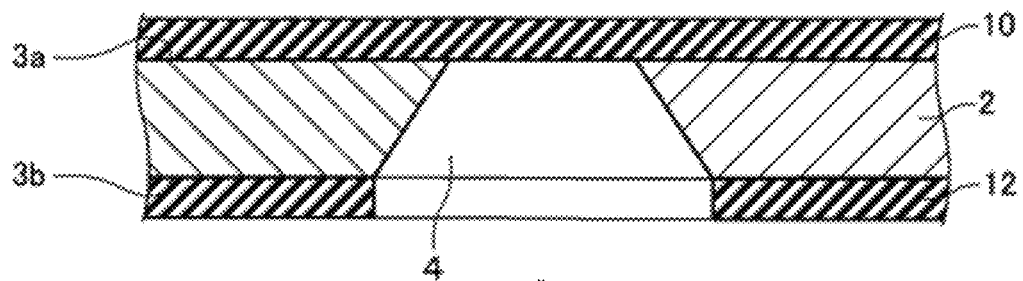
Figure 6:
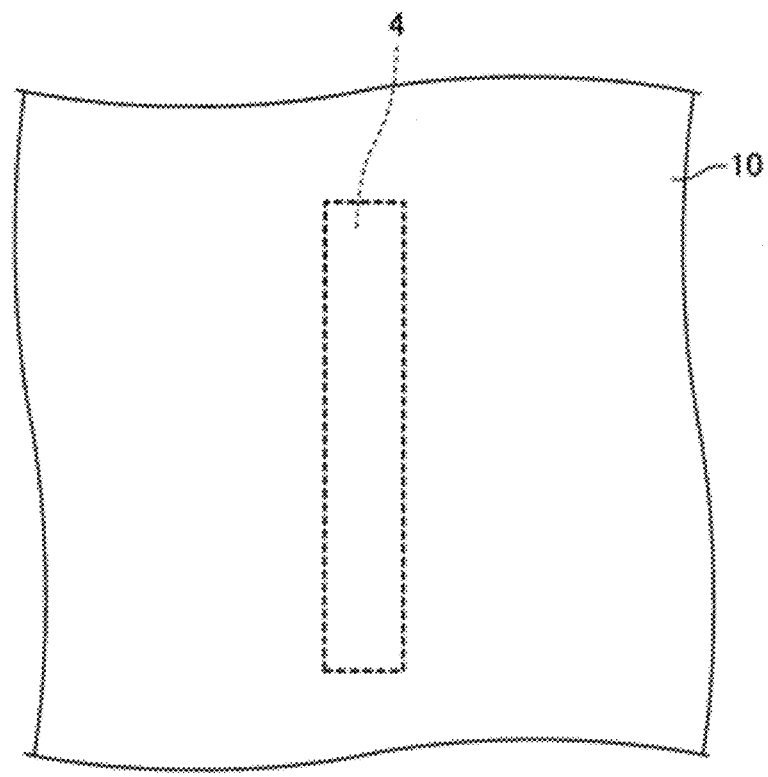
FIG. 6 is a schematic plan view of the sample support membrane shown in FIGS. 2-5, 7, and 8, illustrating one step of fabricating the membrane.

A method associated with a first embodiment of the present invention to fabricate a sample support membrane is first described by referring to FIGS. 1-8. FIG. 1 is a flowchart illustrating one example of the method associated with the first embodiment to fabricate a sample support membrane. FIGS. 2-5, 7, and 8 are schematic cross sections of the sample support membrane, illustrating steps of fabricating the membrane in accordance with the first embodiment. FIG. 6 is a schematic plan view of the sample support membrane, illustrating one step of fabricating it in accordance with the first embodiment.

Figure 2:
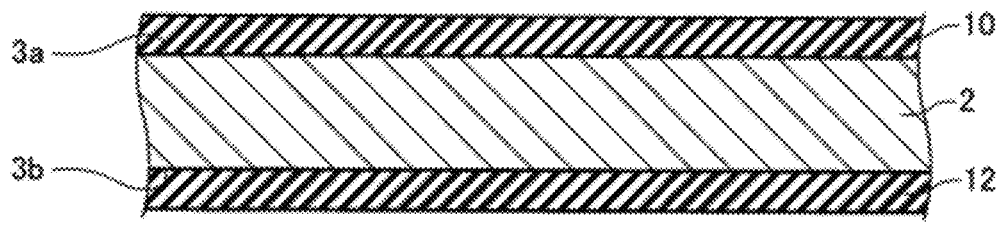

As shown in FIG. 2, a first layer 10 is first deposited on a first surface (top surface in the illustrated example) 3a of a substrate 2 (step S100).

A semiconductor substrate such as a silicon substrate can be used as the substrate 2. Any one of various kinds of substrates such as ceramic substrate, glass substrate, sapphire substrate, and synthetic resin substrate can be used as the substrate 2. Preferably, the first surface 3a of the substrate 2 is a mirror surface. This assures that a film formed on the substrate 2 can be made uniform in thickness. Also, the front surface of the film formed on the substrate 2 can be smoothed. The thickness of the substrate 2 is, for example, between 100 µm and 200 µm, inclusively. The material of the first layer 10 is silicon nitride (SiN), for example. The material of the first layer 10 is not restricted to silicon nitride. The material may also be an insulator such as silicon oxide (SiO2). The first layer 10 is formed, for example, by vacuum evaporation, sputtering, ion plating, or CVD (chemical vapor deposition). The first layer 10 is formed over the whole first surface 3a of the substrate 2.

A mask layer 12 is then formed on a second surface 3b (bottom surface in the illustrated example) of the substrate 2. The second surface 3b of the substrate 2 faces away from the first surface 3a of the substrate 2. For instance, the mask layer 12 is made of the same material as the first layer 10. The mask layer 12 and the first layer 10 may be formed at the same time or by separate processing steps. The mask layer 12 is formed over the whole bottom surface of the substrate 2, for example, by vacuum evaporation, sputtering, ion plating, or CVD.

Figure 3:
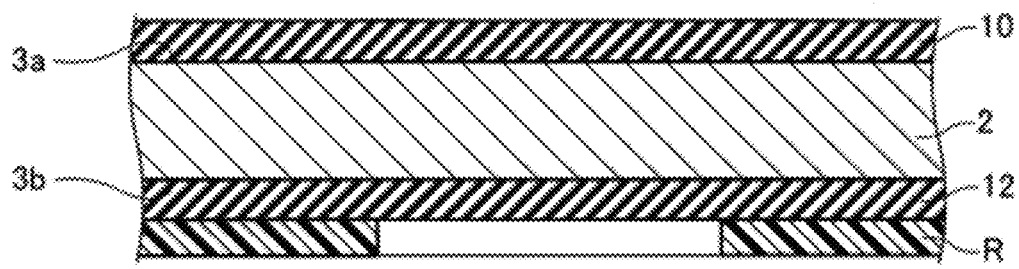

Then, as shown in FIGS. 3-5, the second surface 3b of the substrate 2 is etched to form an opening 4 that exposes the first layer 10 (step S102).

In particular, as shown in FIG. 3, resist R is spin coated on the second surface 3b of the substrate 2 and patterned using a lithography technique or other technique. Subsequently, as shown in FIG. 4, the mask layer 12 is patterned while using the resist R as a mask by reactive ion etching (RIE), plasma etching (PE), ion milling, or other technique. Then, as shown in FIG. 5, the substrate 2 is etched from the second surface 3b while using the mask layer 12 as a mask to form the opening 4 that exposes the first layer 10. This etching is carried out by anisotropically etching the substrate 2 using aqueous solution of potassium hydroxide or TMAH (tetramethyl ammonium hydroxide). As a result, the width of the opening 4 decreases from the second surface 3b of the substrate 2 toward the first surface 3a as viewed in a cross section through it as shown in FIG. 5. The surfaces of the substrate 2 which define the lateral sides of the opening 4 are tilted relative to the direction of thickness of the substrate 2. The opening 4 may be formed by dry etching the substrate 2. As a result of the present processing step, a part of the bottom surface of the first layer 10 is exposed by the opening 4 as shown in FIG. 5.

In the present step S102, if foreign matter such as organic matter or metals adheres to the first layer 10, the first layer 10 can be cleaned with O2 plasma, mixture liquid of sulfuric acid and hydrogen peroxide, or mixture liquid of hydrochloric acid and hydrogen peroxide. As a result, the first layer 10 that is clean is obtained.

FIG. 6 is a schematic plan view of the opening 4, taken during the present step S102. As shown in FIG. 6, the two-dimensional shape of the opening 4 as viewed from the direction of thickness of the substrate 2 is a rectangle having shorter and longer sides. The length of each longer side is 500 µm to 600 µm, for example. The length of each shorter side is 100 µm, for example. The two-dimensional shape of the opening 4 is not restricted to rectangles. The shape may also be a polygon or a circle.

Figure 7:
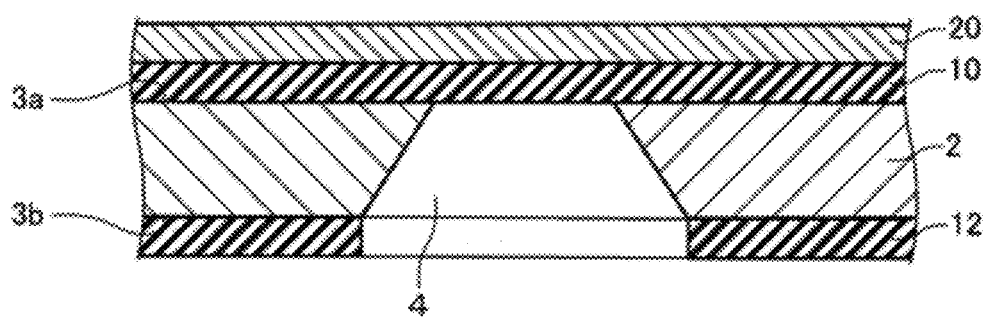

Then, as shown in FIG. 7, a second layer 20 is deposited on the first layer 10 (step S104). A material that can withstand etching used in step S106 (described later) of removing the first layer 10 to expose the second layer 20, i.e., a material showing a lower etch rate than the first layer 10 during this etching, is selected as the material of the second layer 20. For example, where the material of the first layer 10 is silicon nitride or silicon oxide, it is possible to use chromium (Cr), IGZO, or tantalum (Ta) as the material of the second layer 20. IGZO is an oxide semiconductor to which crystallinity has been imparted by oxidizing indium (In), gallium (Ga), and zinc (Zn). The second layer 20 is deposited, for example, by vacuum evaporation, sputtering, ion plating, or CVD. The thickness of the second layer 20 is, for example, between 5 nm and 30 nm, inclusively.

In the present step, the second layer 20 is preferably formed while the internal stress is relaxed as much as possible. If the internal stress is large, it is highly likely that the second layer 20 will be broken or deformed. Accordingly, in the present step, the second layer 20 is preferably deposited under growth conditions where the internal stress is relaxed.

Figure 9:
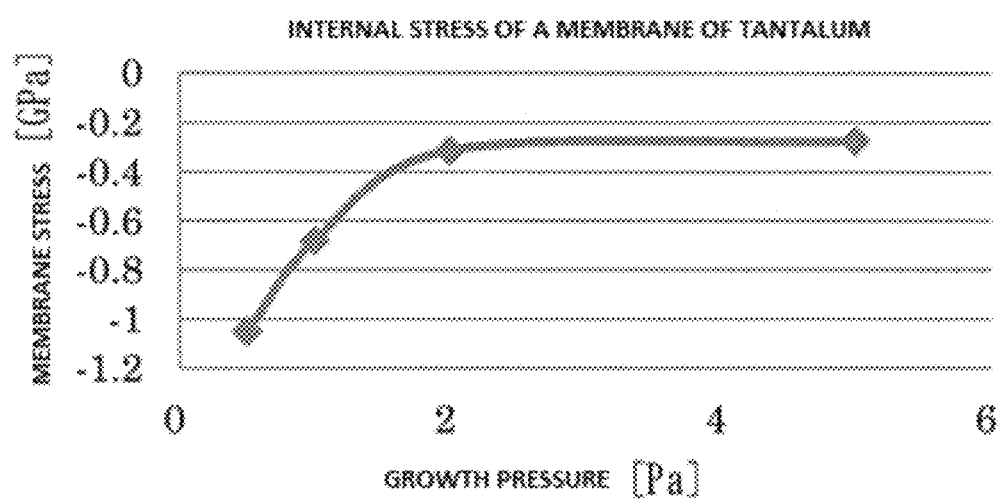
FIG. 9 is a graph illustrating a relationship between the internal stress of a membrane of tantalum and growth pressure.

It is now assumed that the second layer 20 is made of tantalum. FIG. 9 is a graph illustrating a relationship between the internal stress of a membrane of tantalum and growth pressure. As can be seen from this graph, the internal stress of the membrane can be relaxed by increasing the chamber pressure at which the membrane is deposited.

Figure 8:
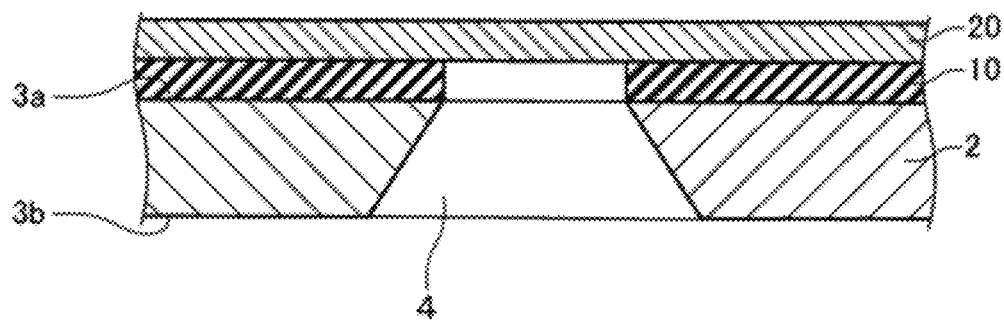

Then, as shown in FIG. 8, the region of the first layer 10 that overlaps the opening 4 as viewed within a plane (i.e., as viewed from the direction of thickness of the substrate 2) is removed to expose the second layer 20 (step S106).

The removal of the region of the first layer 10 overlapping the opening 4 is carried out by plasma etching using a gas such as CF4 or SF6. Consequently, the first layer 10 can be selectively removed while leaving the second layer 20 behind. The removal of the region of the first layer 10 overlapping the opening 4 may be carried out by wet etching using hot phosphoric acid. Also, in this case, the first layer 10 can be selectively removed while leaving the second layer 20 behind. As a result of the present step, a part of the bottom surface of the second layer 20 is exposed as shown in FIG. 8. The second layer 20 is formed as a membrane for supporting an electron microscope sample. During the present step, the mask layer 12 may be removed simultaneously with the first layer 10. Because of the steps described so far, a sample support membrane can be fabricated.

The method associated with the first embodiment to fabricate a sample support membrane has the following features. This method is adapted to fabricate a sample support membrane providing support of an electron microscope sample. This method includes the step S100 for depositing the first layer 10 on the first surface 3a of the substrate 2, the step S102 for etching the second surface 3b of the substrate 2 facing away from the first surface 3a to form the opening 4 that exposes the first layer 10, the step S104 for depositing the second layer 20 on the first layer 10, and the step S106 for removing the region of the first layer 10 that overlaps the opening 4 as viewed within a plane to expose the second layer 20. Therefore, in the method associated with the first embodiment to fabricate a sample support membrane, a sample support membrane can be easily fabricated using a semiconductor fabrication technique such as the MEMS (microelectromechanical system) technology. Furthermore, sample support membranes can be mass-produced economically using a semiconductor fabrication technique. Where the substrate 2 is a 2-inch wafer, if one chip has an outside dimension that measures 3 mm by 3 mm, approximately 100 sample support membranes can be produced at once.

In the method associated with the first embodiment to fabricate a sample support membrane, during the step S104 for depositing the second layer 20, this second layer 20 is formed by vacuum evaporation, sputtering, ion plating, or CVD. Therefore, the thickness of the second layer 20 that is used as a sample support membrane can be controlled easily. A sample support membrane of a desired thickness can be produced easily. Furthermore, in the method associated with the first embodiment to fabricate a sample support membrane, a cleaner membrane can be fabricated, for example, as compared to the case where peeling at a wafer surface is used because a less amount of foreign matter is introduced. In addition, in this method, a thinner membrane can be produced, for example, as compared to the case where peeling at a water surface is used.

Additionally, in the method associated with the first embodiment to fabricate a sample support membrane, the production yield can be improved by controlling the internal stress of the membrane during deposition of the second layer 20. Further, in this method, it is possible to control whether creases appear on a membrane acting as a sample support membrane by controlling the internal stress of the membrane during deposition of the second layer 20.

In the method associated with the first embodiment to fabricate a sample support membrane, the substrate 2 is a silicon substrate and so a sample support membrane can be fabricated easily, for example, using a semiconductor fabrication technique.

In the method associated with the first embodiment to fabricate a sample support membrane, the material of the first layer 10 is silicon nitride. Therefore, the first layer 10 can be formed as a uniform membrane on the substrate 2. If the opening 4 has been formed, the first layer 10 neither deforms nor becomes torn. Rather, the shape can be maintained.

In the method associated with the first embodiment to fabricate a sample support membrane, the material of the second layer 20 is chromium, IGZO, or tantalum. Where silicon nitride is used as the material of the first layer 10, the first layer 10 can be selectively removed during the step of removing the first layer 10 by using chromium, IGZO, or tantalum as the material of the second layer 20.

2. Second Embodiment

Figure 10:
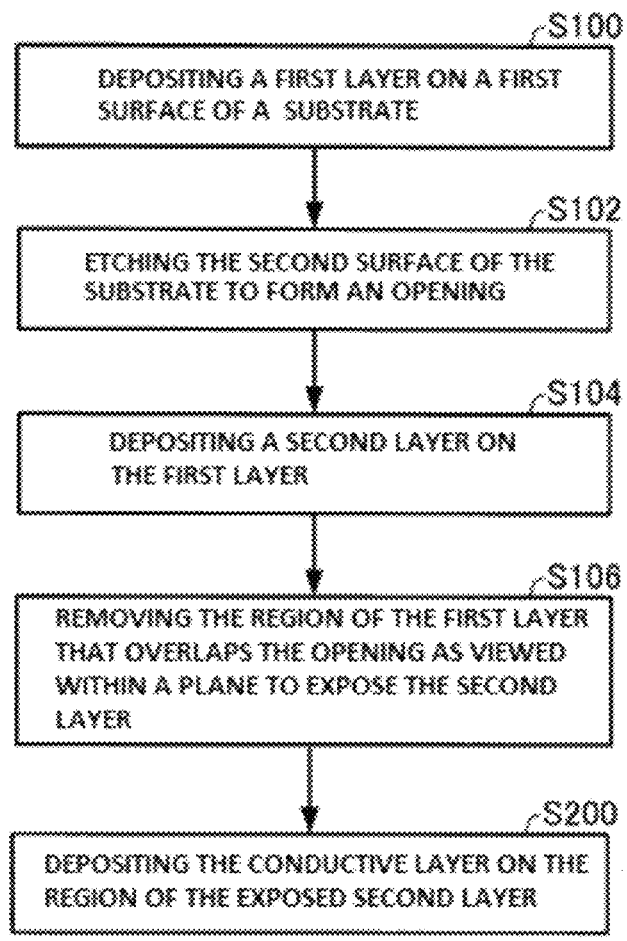
FIG. 10 is a flowchart illustrating one example of a method associated with a second embodiment of the invention to fabricate a sample support membrane.
Figure 11:
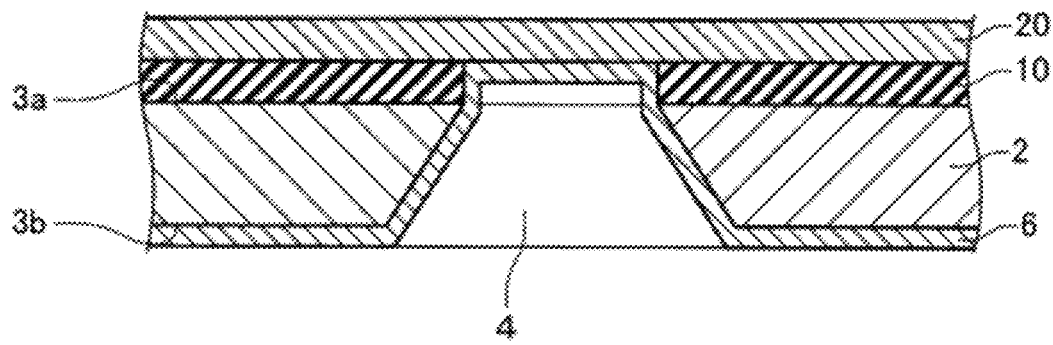
FIG. 11 is a schematic cross-sectional view of a sample support membrane, illustrating one step of fabricating the membrane in accordance with the second embodiment.

A method associated with a second embodiment of the present invention to fabricate a sample support membrane is next described by referring to FIGS. 10 and 11. FIG. 10 is a flowchart illustrating one example of a method associated with the second embodiment. In the description of this method shown in FIG. 10 and associated with the second embodiment, processing steps which are identical with the steps of the method associated with the first embodiment and shown in FIG. 1 are indicated by the same reference numerals as in FIG. 1 and a description thereof is omitted. FIG. 11 is a schematic cross section of a sample support membrane, illustrating one step of fabricating it.

The method associated with the second embodiment to fabricate a sample support membrane includes the step (step S200) of depositing a conductive layer 6 on the region of the second layer 20 that has been exposed by the step S106 for removing the region of the first layer 10 that overlaps the opening 4 as viewed within a plane to expose the second layer 20 as shown in FIG. 10.

After the step S106 (FIG. 8) of removing the region of the first layer 10 that overlaps the opening 4 as viewed within a plane to expose the second layer 20, the conductive layer 6 is deposited on the region of the second layer 20 that is exposed by the step of exposing the second layer 20 (step S200) as shown in FIG. 11.

The conductive layer 6 has electrical conductivity. Preferably, the conductive layer 6 does not affect observation of transmission electron microscope images. For example, the conductive layer 6 is made of amorphous carbon. The conductive layer 6 is formed, for example, on the region exposed by removal of the first layer 10 and also on the substrate 2. The conductive layer 6 is fabricated, for example, by vacuum evaporation, sputtering, ion plating, or CVD. The conductive layer 6 can suppress the second layer 20 from being charged up. Because of the processing steps described so far, a sample support membrane can be formed.

The method associated with the second embodiment to fabricate a sample support membrane can yield the same advantageous effects as the above-described method associated with the first embodiment to fabricate a sample support membrane. In the method associated with the second embodiment, the second layer 20 used as a sample support membrane can be suppressed from being charged up.

3. Third Embodiment

Figure 12:
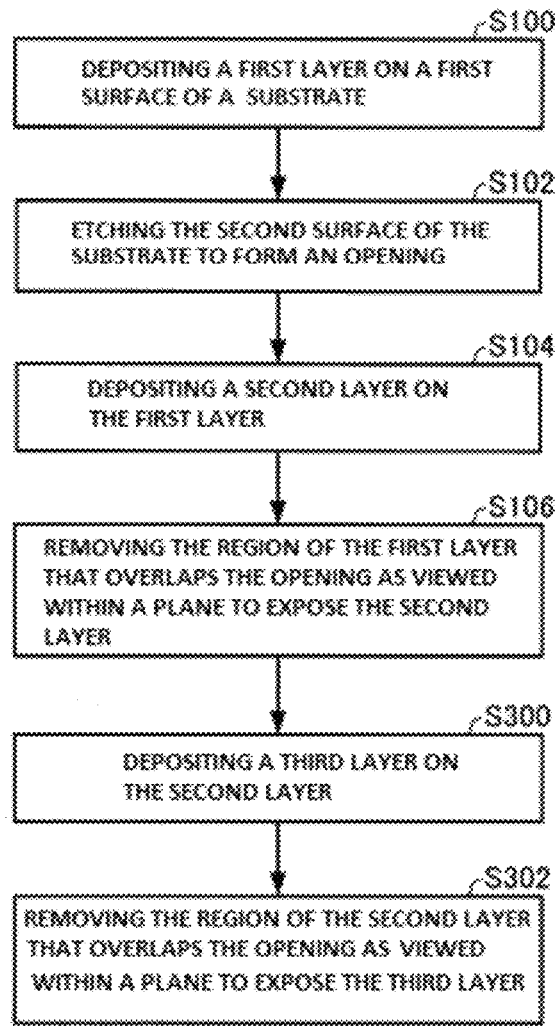
FIG. 12 is a flowchart illustrating one example of a method associated with a third embodiment of the invention to fabricate a sample support membrane.
Figure 13:
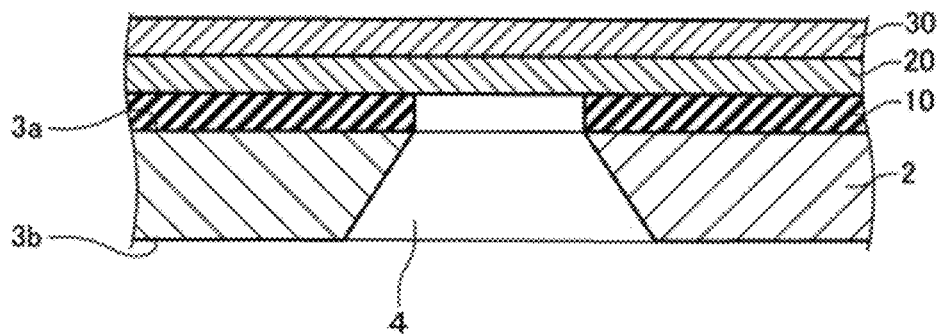
FIGS. 13 and 14 are schematic cross-sectional views of a sample support membrane, illustrating steps of fabricating the membrane in accordance with the third embodiment.
Figure 14:
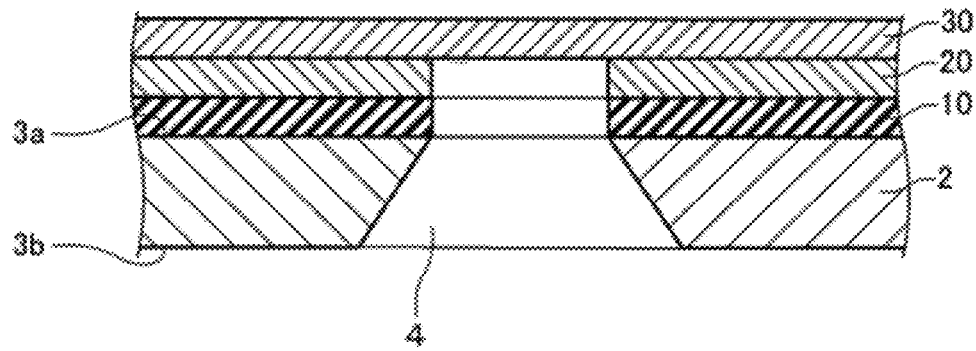

A method associated with a third embodiment of the present invention to fabricate a sample support membrane is next described by referring to FIGS. 12-14. FIG. 12 is a flowchart illustrating one example of the method associated with the third embodiment to fabricate a sample support membrane. In the description of this method shown in FIG. 12 and associated with the third embodiment, processing steps identical to the steps of the method associated with the first embodiment and shown in FIG. 1 are indicated by the same reference numerals as in FIG. 1 and a description thereof is omitted. FIGS. 13 and 14 are schematic cross sections of a sample support membrane, illustrating steps of fabricating it in accordance with the third embodiment.

The method associated with the third embodiment to fabricate a sample support membrane includes the steps of depositing a third layer 30 on the second layer 20 (step S300) and removing the region of the second layer 20 overlapping the opening 4 as viewed within a plane to expose the third layer 30 (step S302) as illustrated in FIG. 12.

After the step S106 (FIG. 8) of removing the region of the first layer 10 overlapping the opening 4 as viewed within a plane, the third layer 30 is deposited on the second layer 20 (step S300) as shown in FIG. 13.

A material that can withstand etching used in the step S302 (described later) of removing the second layer 20, i.e., a material showing a lower etch rate than the second layer 20, during this etching, is selected as the material of the third layer 30. For example, where the material of the second layer 20 is IGZO (whose etchant is oxalic acid) or chromium (whose etchant is red prussiate of potash), it is possible to use any one of carbon, graphene, titanium, platinum, gold, copper (Cu), silver (Ag), aluminum (Al), tungsten (W), osmium (Os), molybdenum (Mo), oxides of these materials, and nitrides of these materials as the material of the third layer 30. The third layer 30 is formed, for example, by vapor evaporation, sputtering, ion plating, or CVD. The thickness of the third layer 30 is, for example, between 5 nm and 30 nm, inclusively.

Then, the region of the second layer 20 that overlaps the opening 4 as viewed within a plane is removed to expose the third layer 30 (step S302).

Where the second layer 20 is made of IGZO, for example, the removal of the region of the second layer 20 that overlaps the opening 4 is carried out by wet etching where oxalic acid is an etchant. Since IGZO is readily etched by an acid, the second layer 20 can be selectively removed by wet etching using oxalic acid. Where the second layer 20 is made of chromium, for example, the removal of the region of the second layer 20 that overlaps the opening 4 is carried out by wet etching where red prussiate of potash is an etchant. Since chromium is easily etched by red prussiate of potash, the second layer 20 can be selectively removed by wet etching using red prussiate of potash. Because of the present step, the third layer 30 is formed as a membrane for supporting an electron microscope sample. A sample support membrane can be fabricated by the processing steps described so far.

The method associated with the third embodiment to fabricate a sample support membrane includes the step S300 of depositing the third layer 30 on the second layer 20 and the step S302 of removing the region of the second layer 20 that overlaps the opening 4 as viewed within a plane to expose the third layer 30. Therefore, a membrane material forming the sample support membrane can be selected from a wider range of choices.

In the method associated with the first embodiment to fabricate a sample support membrane, a material capable of withstanding the etchant for the first layer 10 formed on the substrate 2 must be selected as the material of a membrane (i.e., the second layer 20) used as a sample support membrane. On the other hand, in the method associated with the third embodiment to fabricate a sample support membrane, it is only necessary that a material capable of standing up to the etchant for the second layer 20 be selected as the material of the membrane (i.e., third layer 30) used as a sample support membrane. Therefore, by using IGZO, chromium, or tantalum showing a high etch rate for a given etchant as the material of the second layer 20, the material of the membrane used as a sample support membrane can be selected from a wider range of choices.

In the method associated with the third embodiment to fabricate a sample support membrane, during the step S300 of depositing the third layer 30 on the second layer 20, the third layer 30 is formed by vacuum evaporation, sputtering, ion plating, or CVD. Therefore, the thickness of the third layer 30 used, for example, as a sample support membrane can be controlled easily. Thus, a sample support membrane of a desired thickness can be formed easily. Furthermore, in this method, a cleaner membrane can be fabricated, for example, as compared to the case where peeling at a water surface is employed because a less amount of foreign matter is introduced. In addition, in this method associated with the third embodiment, a thinner membrane can be formed, for example, as compared to the case where peeling at a water surface is used. Further, in this method associated with the third embodiment, the production yield can be enhanced by controlling the internal stress of the membrane.

The method associated with the third embodiment to fabricate a sample support membrane may include the step of depositing the conductive layer 6 (FIG. 11) on the region of the third layer 30 that has been exposed by the step S302 of exposing the third layer 30. Consequently, in the method associated with the third embodiment, the conductive layer 6 can suppress the third layer 30 from being charged up in the same way as in the method associated with the second embodiment.

4. Fourth Embodiment

Figure 15:
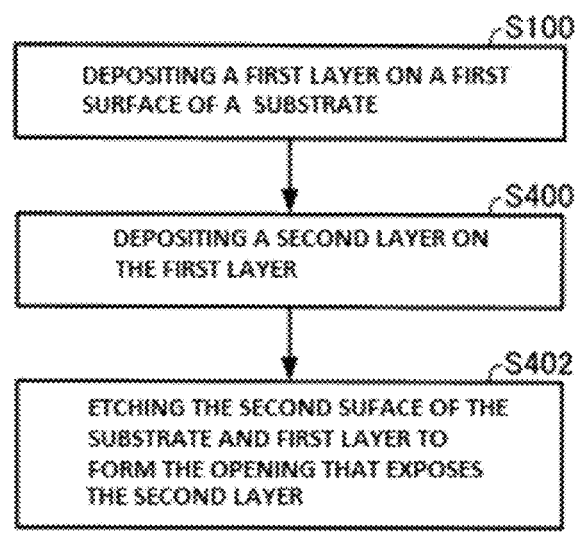
FIG. 15 is a flowchart illustrating one example of a method associated with a fourth embodiment of the invention to fabricate a sample support membrane.
Figure 16:
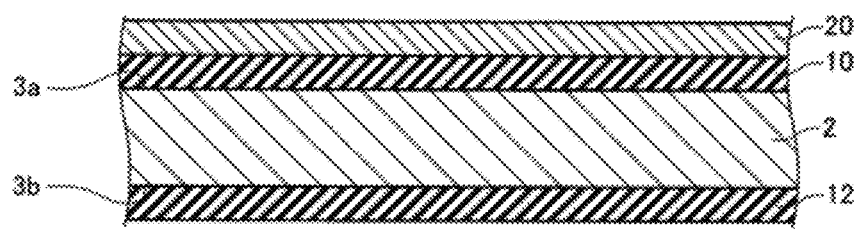
FIGS. 16 and 17 are schematic cross-sectional views of a sample support membrane, illustrating steps of fabricating the membrane in accordance with the fourth embodiment.
Figure 17:
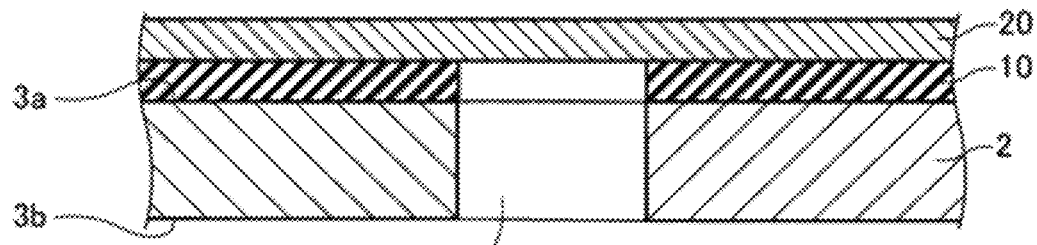

A method associated with a fourth embodiment of the present invention to fabricate a sample support membrane is next described by referring to FIGS. 15-17. FIG. 15 is a flowchart illustrating one example of the method associated with the fourth embodiment to fabricate a sample support membrane. In the description of the method provided in connection with FIG. 15, processing steps identical to the steps of the method associated with the first embodiment and shown in FIG. 1 are indicated by the same reference numerals as in FIG. 1 and a description thereof is omitted. FIGS. 16 and 17 are schematic cross-sectional views of a sample support membrane, illustrating steps of fabricating the membrane in accordance with the fourth embodiment.

In the above-described method associated with the first embodiment to fabricate a sample support membrane, after the step S102 of etching the second surface 3*b* of the substrate 2 to form the opening 4 as shown in FIG. 1, the step S104 of depositing the second layer 20 on the first layer 10 is performed.

On the other hand, in the method associated with the fourth embodiment to fabricate a sample support membrane, after the step S400 of depositing the second layer 20 on the first layer 10, step S402 of etching the second surface 3*b* of the substrate 2 and the first layer 10 to form the opening 4 that exposes the second layer 20 is performed as illustrated in FIG. 16.

After the step S100 of depositing the first layer 10 on the first surface 3*a* of the substrate 2 as shown in FIG. 2, the second layer 20 is formed on the first layer 10 as shown in FIG. 16 (step S400).

The second layer 20 is made, for example, of chromium. The second layer 20 is formed, for example, by vacuum evaporation, sputtering, ion plating, or CVD. Then, as shown in FIG. 17, the second surface 3*b* of the substrate 2 and first layer 10 are etched to form the opening 4 that exposes the second layer 20 (step S402).

The opening 4 is formed, for example, by dry etching. In particular, resist (not shown) is first spin coated on the second surface 3*b* of the substrate 2 and patterned using a lithography technique or other technique. Then, the mask layer 12 is patterned using the resist as a mask by reactive ion etching, plasma etching, ion milling, or other technique. Then, the substrate 2 is dry etched from the second surface 3*b* while using the mask layer 12 as a mask to form an opening that exposes the first layer 10. After the opening for exposing the first layer 10 has been formed, the etching is made to proceed to remove the first layer 10 and to form the opening 4 that exposes the second layer 20. Since the substrate 2 is dry etched, the width of the opening 4, taken across its cross section, is constant as shown in FIG. 16. That is, the surfaces of the substrate 2 defining the lateral sides of the opening 4 are parallel to the direction of thickness of the substrate 2. As a result of the present step, a part of the lower surface of the second layer 20 is exposed and the second layer 20 is formed as a membrane providing support of an electron microscope sample as shown in FIG. 17. Because of the processing steps described so far, the sample support membrane can be fabricated.

The method associated with the fourth embodiment to fabricate a sample support membrane can yield the same advantageous effects as the above-described method associated with the first embodiment.

5. Fifth Embodiment

Figure 18:
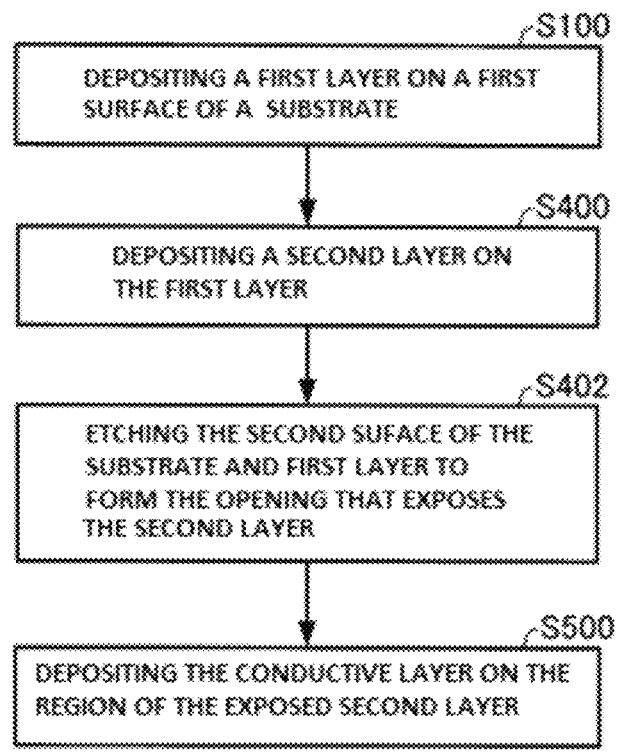
FIG. 18 is a flowchart illustrating one example of a method associated with a fifth embodiment of the present invention to fabricate a sample support membrane.
Figure 19:
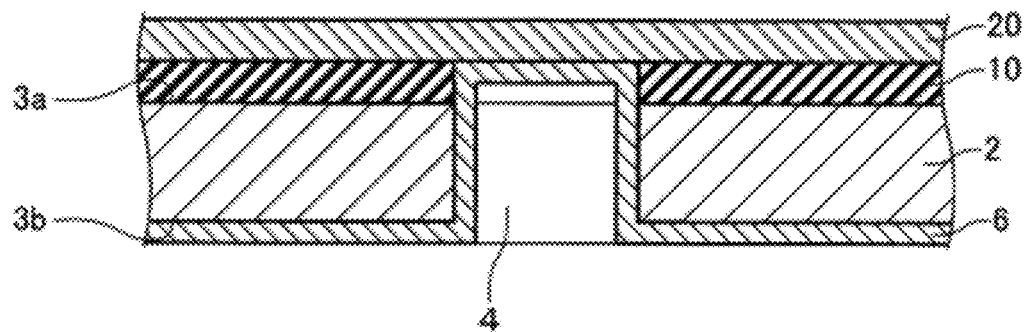
FIG. 19 is a schematic cross-sectional view of the sample support membrane, illustrating one step of fabricating it in accordance with the fifth embodiment.

A method associated with a fifth embodiment of the present invention to fabricate a sample support membrane is next described by referring to FIGS. 18 and 19. FIG. 18 is a flowchart illustrating one example of the method associated with the fifth embodiment to fabricate a sample support membrane. Those processing steps of the method associated with the fifth embodiment and shown in FIG. 18 which are similar to their respective counterparts of the method associated with the fourth embodiment and shown in FIG. 15 are indicated by the same reference numerals as in FIG. 15 and a description thereof is omitted. FIG. 19 is a schematic cross section of a sample support membrane, illustrating a step of fabricating it in accordance with the fifth embodiment.

The method associated with the fifth embodiment to fabricate a sample support membrane includes step S500 of depositing the conductive layer 6 on the region of the second region 20 that has been exposed by the step S402 of etching the second surface 3*b* of the substrate 2 and the first layer 10 to form the opening 4 that exposes the second layer 20 as illustrated in FIG. 18.

After the step S402 (FIG. 17) of forming the opening 4 that exposes the second layer 20 by etching the second surface 3*b* of the substrate 2 and the first layer 10, the conductive layer 6 is formed (step S500) on the region of the second layer 20 that has been exposed by the step of forming the opening 4 as shown in FIG. 19.

As shown in FIG. 19, the conductive layer 6 is formed on the region of the second layer 20 exposed by the opening 4 and also on the substrate 2. The conductive layer 6 is formed, for example, by vacuum evaporation, sputtering, ion plating, or CVD. The conductive layer 6 can suppress the second layer 20 from being charged up. Because of the processing steps described so far, a sample support membrane can be fabricated.

The method associated with the fifth embodiment to fabricate a sample support membrane can yield the same advantageous effects as the above-described method associated with the fourth embodiment to fabricate a sample support membrane. Furthermore, in this method associated with the fifth embodiment, the second layer 20 used as a sample support membrane can be suppressed from being charged up.

6. Sixth Embodiment

Figure 20:
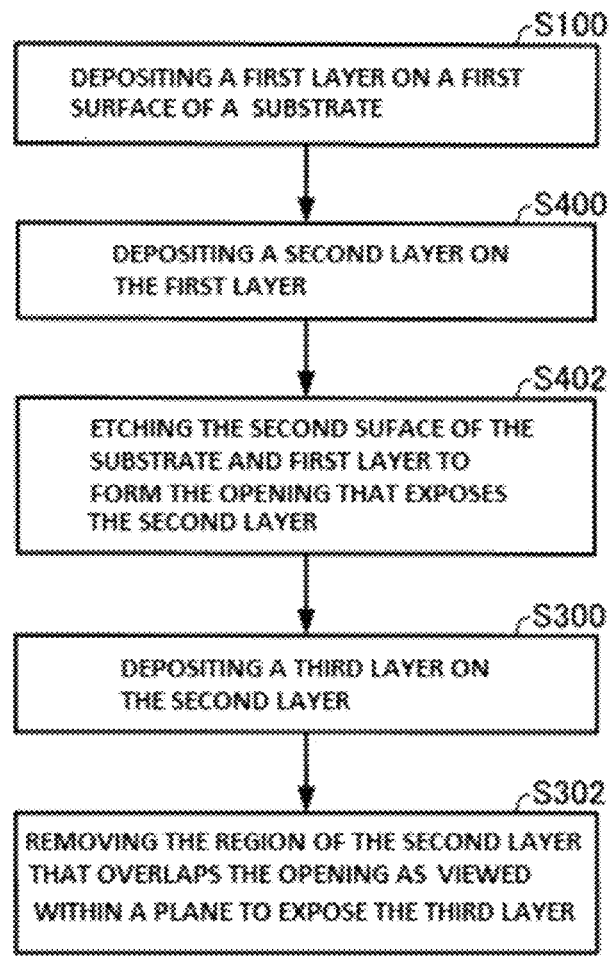
FIG. 20 is a flowchart illustrating one example of a method associated with a sixth embodiment of the present invention to fabricate a sample support membrane.
Figure 21:
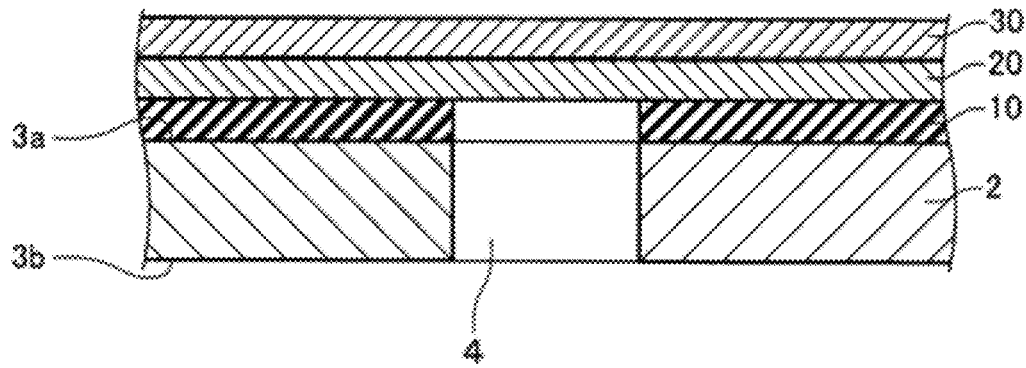
FIGS. 21 and 22 are schematic cross-sectional views of the sample support membrane, illustrating steps of fabricating the membrane in accordance with the sixth embodiment.
Figure 22:
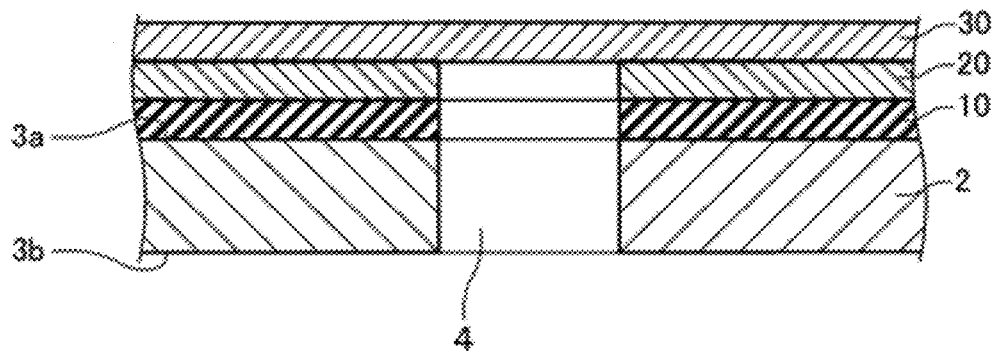

A method associated with a sixth embodiment of the present invention to fabricate a sample support membrane is next described by referring to FIGS. 20-22. FIG. 20 is a flowchart illustrating one example of the method associated with the sixth embodiment to fabricate a sample support membrane. Those processing steps of the method associated with the sixth embodiment and shown in FIG. 20 which are similar to the processing steps of the third and fourth embodiments shown in FIGS. 12 and 15, respectively, are indicated by the same reference numerals as in FIGS. 12 and 15 and a description thereof is omitted. FIGS. 21 and 22 are schematic cross sections of a sample support membrane, illustrating steps of fabricating the membrane in accordance with the sixth embodiment.

In the method associated with the sixth embodiment to fabricate a sample support membrane, step S402 of etching the second surface 3*b* of the substrate 2 and the first layer 10 to form the opening 4 that exposes the second layer 20 is followed by step S300 of depositing the third layer 30 on the second layer 20 and the step S302 of removing the region of the second layer 20 that overlaps the opening 4 as viewed within a plane to expose the third layer 30 as illustrated in FIG. 20.

After the step S402 (FIG. 17) of etching the second surface 3b of the substrate 2 and the first layer 10 to form the opening 4 that exposes the second layer 20, the third layer 30 is deposited on the second layer 20 as shown in FIG. 21 (step S300).

Then, as shown in FIG. 22, the region of the second layer 20 that overlaps the opening 4 as viewed within a plane is removed to expose the third layer 30 (step S302). The steps S300 and S302 shown in FIGS. 21 and 22 are performed similarly to the above-described steps S300 and S302 (FIGS. 13 and 14) of the method associated with the third embodiment to fabricate a sample support membrane.

In the method associated with the sixth embodiment to fabricate a sample support membrane, the material of a membrane used as a sample support membrane can be selected from a wider range of choices in the same way as in the method associated with the third embodiment.

The method associated with the sixth embodiment to fabricate a sample support membrane can further include the step of forming the conductive layer 6 (FIG. 19) on the region of the third layer 30 exposed by the step S302 of exposing the third layer 30. Consequently, in the method associated with the sixth embodiment to fabricate a sample support membrane, the conductive layer 6 can suppress the third layer 30 from being charged up in the same way as in the method associated with the fifth embodiment.

7. Seventh Embodiment

Figure 23:
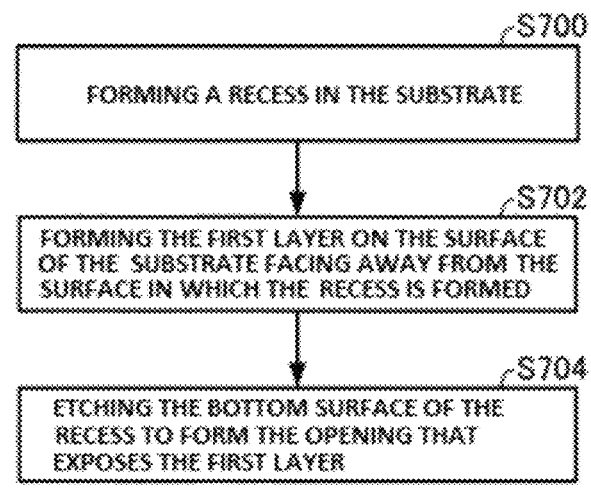
FIG. 23 is a flowchart illustrating one example of a method associated with a seventh embodiment of the present invention to fabricate a sample support membrane.

A method associated with a seventh embodiment to fabricate a sample support membrane is next described by referring to FIGS. 23-30. FIG. 23 is a flowchart illustrating one example of the method associated with the seventh embodiment to fabricate a sample support membrane. FIGS. 24-30 are schematic cross sections of a sample support membrane, illustrating steps of the method associated with the seventh embodiment.

Figure 24:
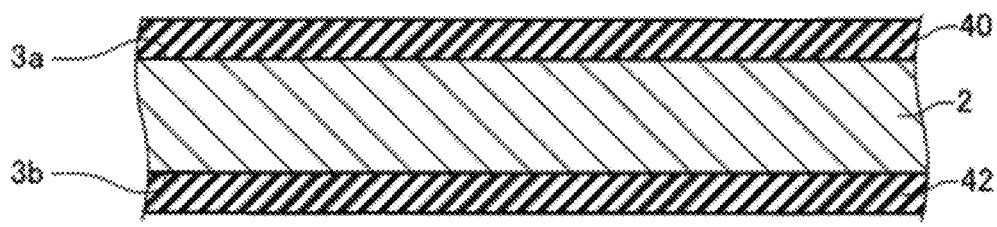
FIGS. 24-30 are schematic cross-sectional views of a sample support membrane, illustrating steps of fabricating it in accordance with the seventh embodiment.

First, as shown in FIGS. 24-27, a recess 8 is formed in the substrate 2 (step S700). In particular, as shown in FIG. 24, a protective film 40 is first deposited on the first surface 3a of the substrate 2. Another protective film 42 is deposited on the second surface 3b of the substrate 2.

A semiconductor substrate such as a silicon substrate can be used as the substrate 2. Any one of various kinds of substrates such as ceramic substrate, glass substrate, sapphire substrate, and synthetic resin substrate may be used as the substrate 2. Preferably, the first surface 3a of the substrate 2 is a mirror surface. This assures that a membrane formed on the substrate 2 can be made uniform in thickness. Also, the front surface of the film formed on the substrate 2 can be smoothed. The thickness of the substrate 2 is, for example, between 100 µm and 200 µm inclusively.

The protective films 40 and 42 are made of a material that can protect the substrate 2 when the substrate 2 is etched as described later. In particular, the protective films 40 and 42 are made of an oxide (such as silicon oxide), silicon nitride film, aluminum, chromium, or other material. The protective films 40 and 42 are formed, for example, by vacuum evaporation, sputtering, ion plating, or CVD. Where the substrate 2 is made of a silicon substrate, the protective films 40 and 42 may be formed by thermal oxidation. In this case, the material of the protective films 40 and 42 is silicon oxide (SiO2).

Figure 25:
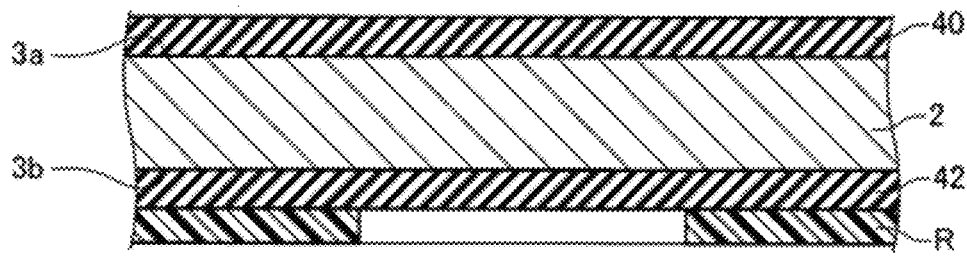
Figure 26:
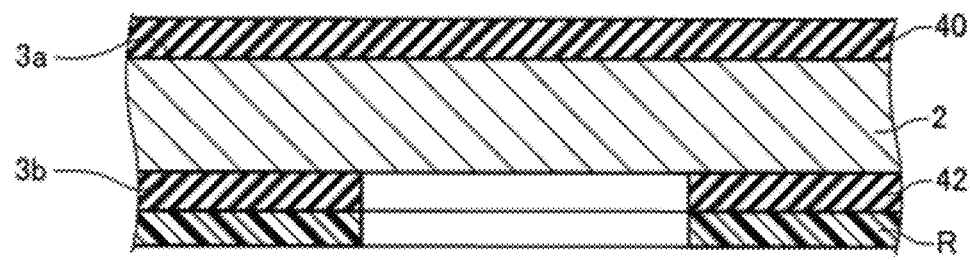
Figure 27:
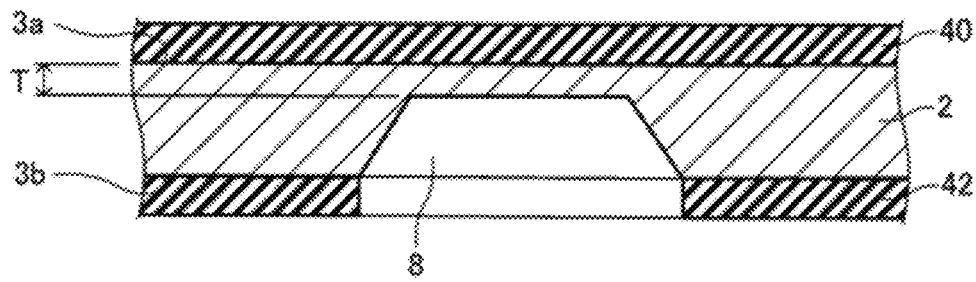

Then, as shown in FIG. 25, resist R is deposited on the protective film 42 and patterned by a lithography technique such as photolithography or electron beam exposure. Then, as shown in FIG. 26, the protective film 42 is wet etched or dry etched while using the resist R as a mask, thus patterning the protective film 42. The resist R is then removed. Then, as shown in FIG. 27, the substrate 2 is etched to form the recess 8 while using the protective film 42 as a mask. The etching of the substrate 2 is carried out by anisotropically etching the substrate 2 using aqueous solution of potassium hydroxide or TMAH (tetramethyl ammonium hydroxide). Alternatively, the etching of the substrate 2 may be carried out using reactive ion etching (such as a deep trench RIE process). The thickness T of the portion of the substrate 2 where the recess 8 is formed, i.e., the distance between the bottom surface of the recess 8 and the first surface 3a of the substrate 2 is preferably 50 µm or less. Because of the processing steps described so far, the recess 8 can be formed in the substrate 2.

Figure 28:
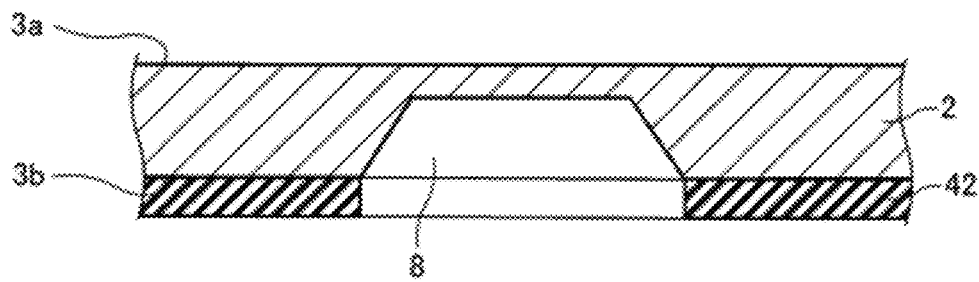
Figure 29:
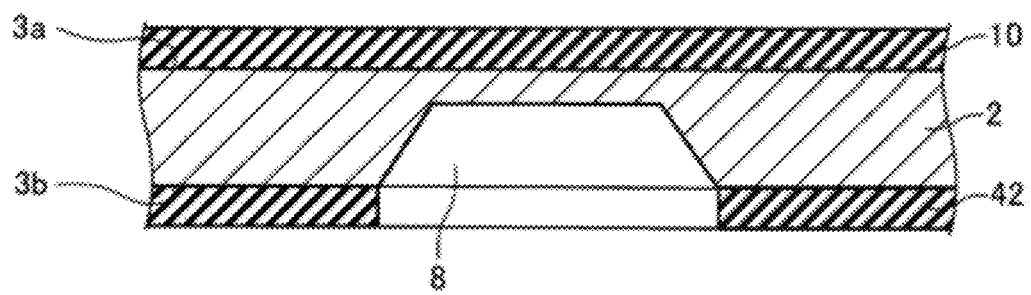

Then, as shown in FIG. 28, the protective film 40 on the first surface 3a of the substrate 2 is removed to expose the first surface 3a. Where the protective film 40 is an oxide (such as silicon oxide), the protective film 40 is removed by wet etching using hydrofluoric acid. Then, as shown in FIG. 29, the first layer 10 is deposited on the first surface 3a of the substrate 2 (step S702).

Preferably, the material of the first layer 10 can withstand the process (step S704) (described later) of etching the bottom surface of the recess 8 in the substrate 2. In particular, the material of the first layer 10 is carbon (graphene, amorphous carbon, or diamond-like carbon), an oxide (such as silicon oxide), silicon nitride, aluminum, chromium, or other material. The first layer 10 is formed, for example, by vacuum evaporation, sputtering, ion plating, or CVD. The thickness of the first layer 10 is, for example, between 5 nm and 30 nm, inclusively. The first layer 10 is formed, for example, over the whole first surface 3a of the substrate 2.

Figure 30:
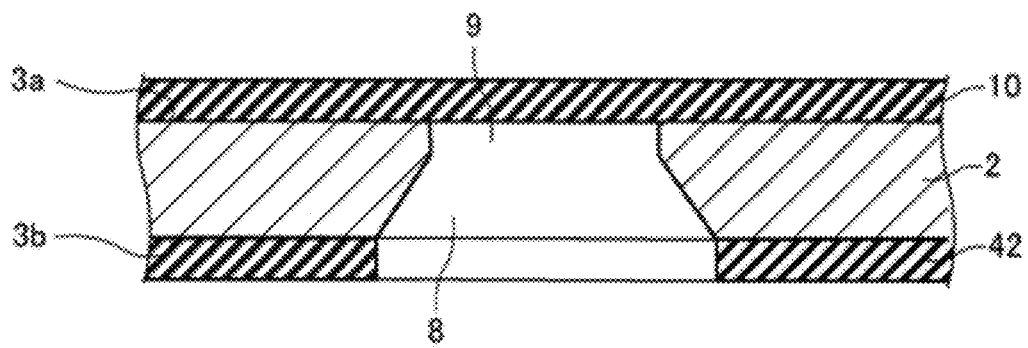

Then, as shown in FIG. 30, the bottom surface of the recess 8 in the substrate 2 is etched to form an opening 9 that exposes the first layer 10 (step S704). This etching of the bottom surface is carried out, for example, by dry etching using xenon difluoride (XeF2) gas. Since dry etching using XeF2 gas is isotropic etching, the thickness T (FIG. 27) of the substrate 2 is preferably made small during the step S700 of forming the recess 8 in the substrate 2. For example, the above-described thickness T of the substrate 2 is preferably made equal to or less than 50 µm. This facilitates controlling the two-dimensional shape of the region acting as a sample support membrane for a membrane consisting of the first layer 10. Because of the processing steps described so far, a sample support membrane can be fabricated.

The method associated with the seventh embodiment to fabricate a sample support membrane has the following features. This method associated with the seventh embodiment includes the step S700 of forming the recess 8 in the substrate 2, step S702 of forming the first layer 10 on the surface 3a of the substrate 2 facing away from the surface 3b in which the recess 8 is formed, and step S704 of etching the bottom surface of the recess 8 to form the opening 9 that exposes the first layer 10. Consequently, in the method associated with the seventh embodiment to fabricate a sample support membrane, a sample support membrane can be easily fabricated using a semiconductor fabrication technique. Furthermore, sample support membranes can be mass-produced economically by the use of a semiconductor fabrication technique.

Furthermore, in the method associated with the seventh embodiment to fabricate a sample support membrane, during the step S702 of forming the first layer 10, the first layer 10 can be formed by vacuum evaporation, sputtering, ion plating, or CVD. Therefore, the thickness of the first layer 10 used as a sample support membrane can be easily controlled. A sample support membrane of a desired thickness can be formed easily. Additionally, in the method associated with the seventh embodiment, a cleaner membrane can be formed, for example, as compared to the case where peeling at a water surface is employed because a less amount of foreign matter is introduced. Further, in this method associated with the seventh embodiment, a thinner membrane can be formed, for example, as compared to the case where peeling at a water surface is employed.

Additionally, in the method associated with the seventh embodiment to fabricate a sample support membrane, the production yield can be improved by controlling the internal stress in the membrane during deposition of the first layer 10. Further, it is possible to control the presence or absence of creases appearing on the membrane that becomes a sample support membrane.

Further, in the method associated with the seventh embodiment to fabricate a sample support membrane, during the step S704 of forming the opening 9, the etching of the bottom surface of the recess 8 is carried out by dry etching using XeF2 gas. Therefore, a cleaner membrane can be obtained, for example, as compared to the case where the bottom surface of the recess is wet etched. Furthermore, in FIG. 29, where the adhesiveness between the first layer 10 (such as a carbon layer) and the substrate 2 (such as a silicon substrate) is low, if the bottom surface of the recess 8 is etched using an alkaline etchant (such as aqueous solution of potassium hydroxide), the first layer 10 may peel off from the substrate 2. This peeling of the first layer 10 from the substrate 2 can be prevented by dry etching using XeF2 gas.

An experimental example is given below to describe the present invention in further detail. Note that the present invention is by no means restricted thereby.

Experimental Example

A sample support membrane was produced by the above-described method associated with the seventh embodiment. The protective films 40 and 42 were made of SiO2 (thermal oxide film). The resist R was a positive resist AZ1500 20 cp, produced by AZ Electronic Materials. The etching for forming the recess 8 in the substrate 2 was carried out by anisotropic etching using aqueous solution of potassium hydroxide (KOH). The removal of the protective film 40 of SiO2 was carried out by wet etching using buffered hydrofluoric acid (BHF). The first layer 10 was made of carbon. The first layer 10 was deposited by resistively heated evaporation using a JEE-420 vacuum evaporator available from JEOL Ltd. The etching of the substrate 2 for forming the opening 9 was performed by dry etching using XeF2 gas using a Si sacrificial layer dry etching system Xetch 3B manufactured by Xactix Inc.

Figure 31:
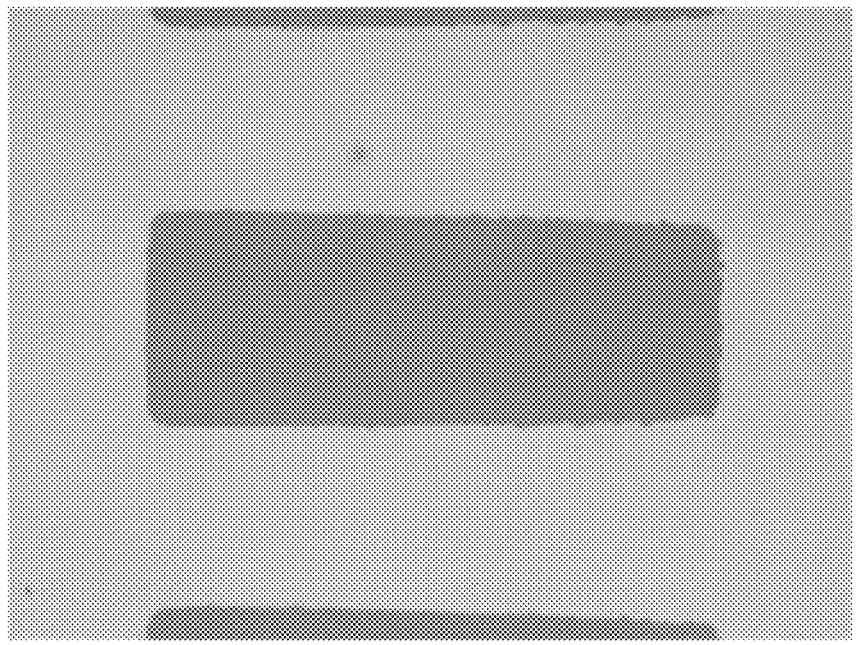
FIG. 31 is an optical microscope image of the front surface of a sample support membrane fabricated in one experimental example of the present invention.
Figure 32:
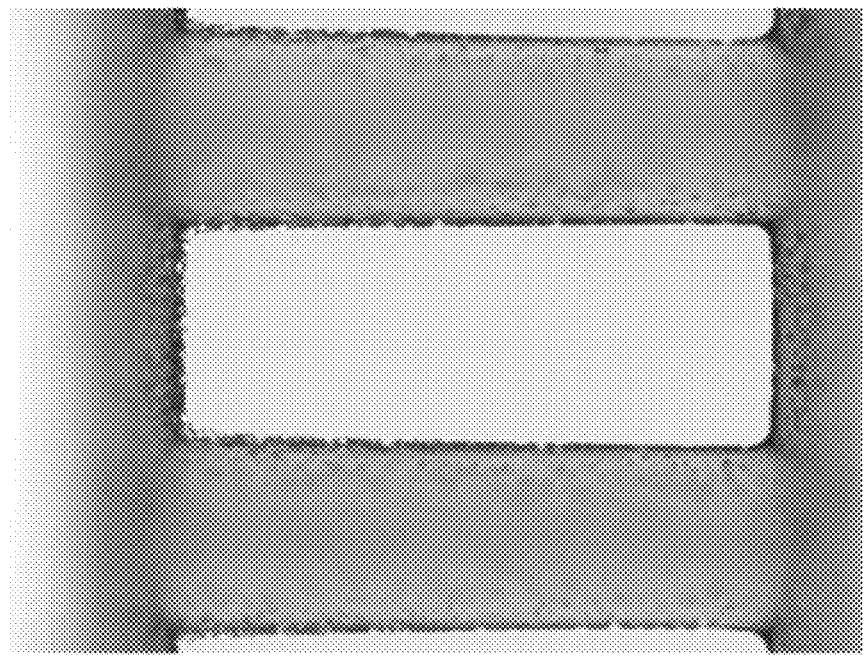
FIG. 32 is an optical microscope image of the rear surface of the sample support membrane whose front surface is shown in FIG. 31.
Figure 33:
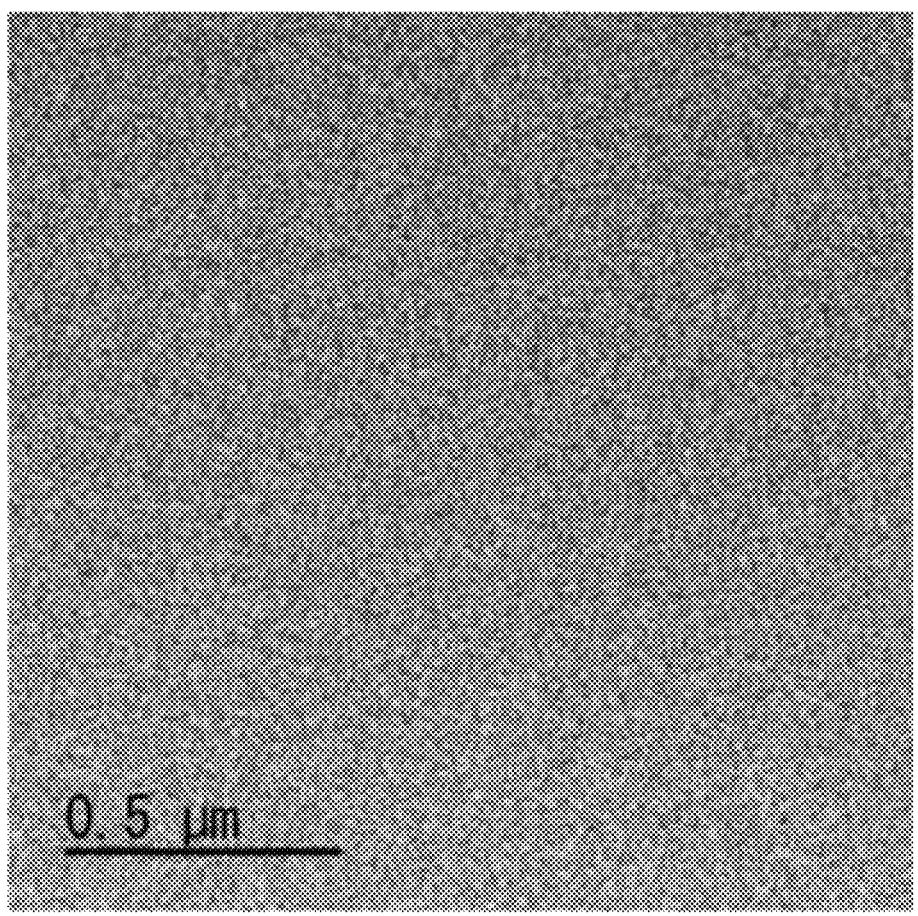
FIG. 33 is a transmission electron microscope image of the sample support membrane shown in FIGS. 31 and 32.
Figure 34:
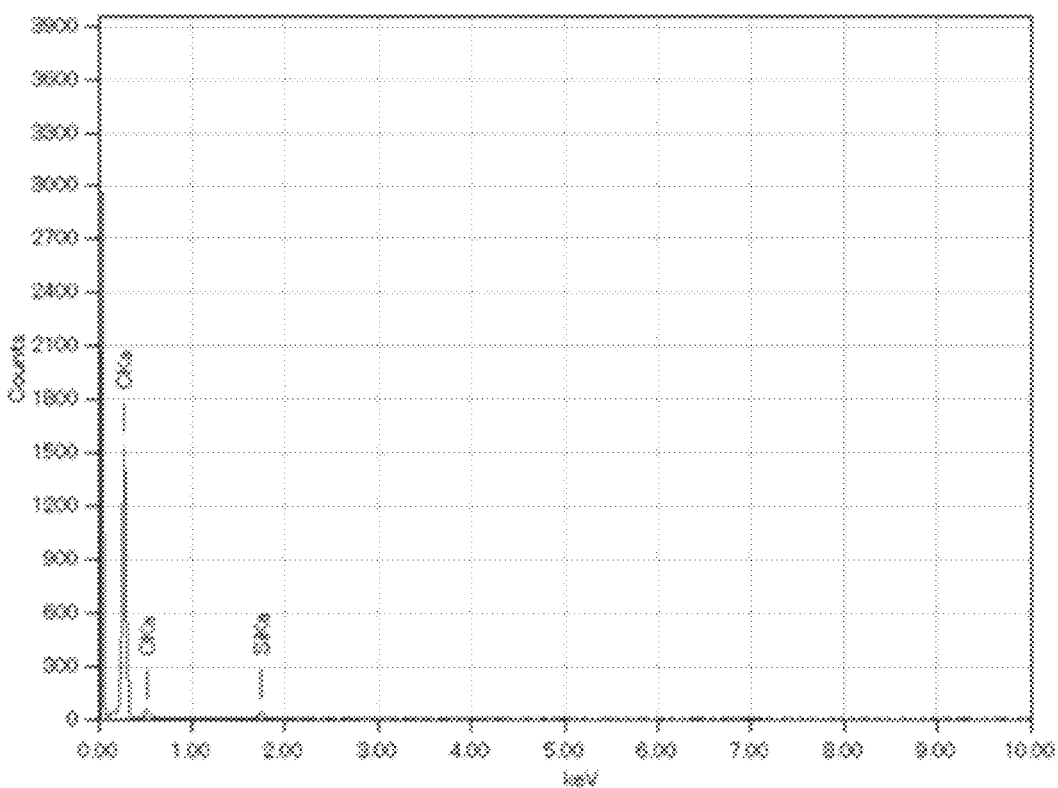
FIG. 34 is an EDS spectrum of the sample support membrane shown in FIGS. 31-33.

FIG. 31 is an optical microscope image of the front surface of a sample support membrane fabricated by the present experimental example. FIG. 32 is an optical microscope image of the rear surface of this sample support membrane. FIG. 33 is a transmission electron microscope image of this sample support membrane fabricated by the present experimental example. FIG. 34 is an EDS spectrum of the sample support membrane fabricated by the present experimental example.

The results shown in FIGS. 31-34 show that a carbon membrane having a desired shape and free from foreign matter has been successfully produced in the present experimental example.

8. Eighth Embodiment

Figure 35:
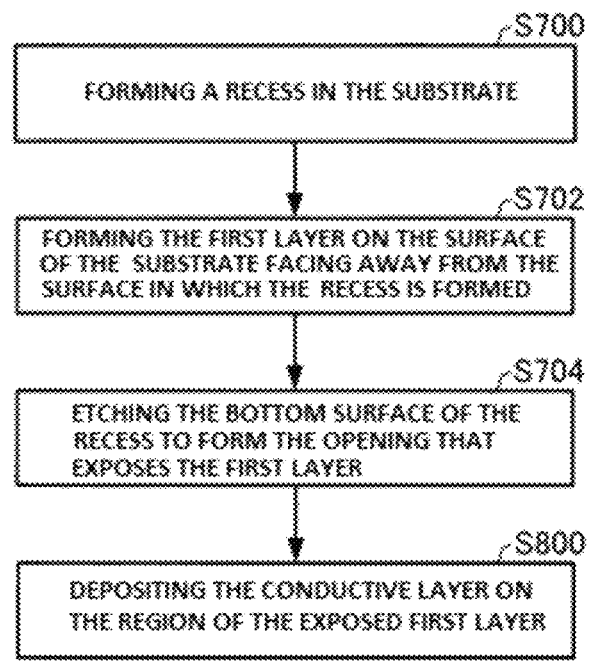
FIG. 35 is a flowchart illustrating one example of a method associated with an eighth embodiment of the present invention to fabricate a sample support membrane.
Figure 36:
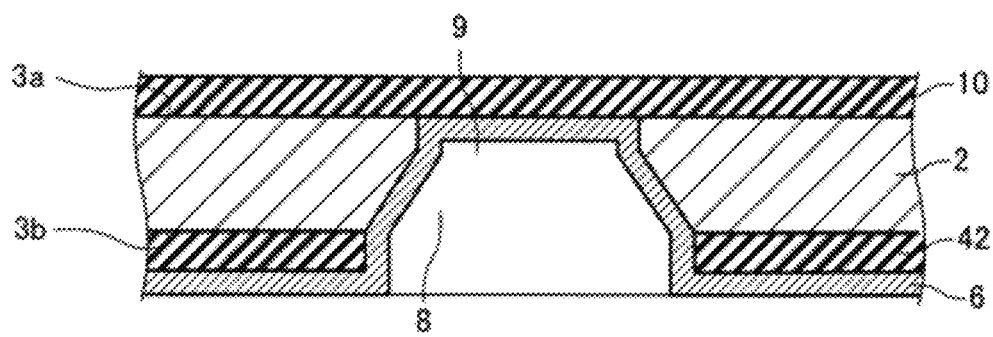
FIG. 36 is a schematic cross-sectional view of a sample support membrane, illustrating one step of fabricating the membrane in accordance with the eighth embodiment.

A method associated with an eighth embodiment of the present invention is next described by referring to FIGS. 35 and 36. FIG. 35 is a flowchart illustrating one example of the method associated with the eighth embodiment. Those processing steps of the method associated with the eighth embodiment and shown in FIG. 35 which are similar to the steps of the method associated with the seventh embodiment and shown in FIG. 23 are indicated by the same reference numerals as in FIG. 23 and a description thereof is omitted. FIG. 36 is a schematic cross-sectional view of a sample support membrane, illustrating one step of fabricating it in accordance with the eighth embodiment.

The method associated with the eighth embodiment to fabricate a sample support membrane includes step S800 of forming the conductive layer 6 on the region of the first layer 10 which has been exposed by the step S704 of forming the opening 9 as illustrated in FIG. 35.

After the step S704 (FIG. 30) of forming the opening 9 that exposes the first layer 10, the conductive layer 6 is formed on the region of the first layer 10 which has been exposed by the step of forming the opening 9 as shown in FIG. 36 (step S800).

The conductive layer 6 has electrical conductivity. Preferably, the conductive layer 6 does not affect observation of TEM images. For example, the conductive layer 6 is made of amorphous carbon. The conductive layer 6 is formed on the region of the first layer 10 overlapping the opening 9 as viewed within a plane and also on the substrate 2. The conductive layer 6 is formed, for example, by vacuum evaporation, sputtering, ion plating, or CVD. The conductive layer 6 can suppress the first layer 10 from being charged up. Because of the processing steps described so far, the sample support membrane can be produced.

The method associated with the eighth embodiment to fabricate a sample support membrane can yield the same advantageous effects as the above-described method associated with the seventh embodiment to fabricate a sample support membrane. Furthermore, in the method associated with the eighth embodiment, the conductive layer 6 can suppress the first layer 10 used as a sample support membrane from being charged up.

It is to be understood that the above-described embodiments are merely exemplary and that the present invention is not restricted thereto. For example, some of the embodiments may be combined appropriately.

The present invention embraces configurations (e.g., configurations identical in function, method, and results or identical in purpose and advantageous effects) which are substantially identical to the configurations described in any one of the above embodiments. Furthermore, the invention embraces configurations which are similar to the configurations described in any one of the above embodiments except that their nonessential portions have been replaced. Additionally, the invention embraces configurations which are identical in advantageous effects to, or which can achieve the same object as, the configurations described in any one of the above embodiments. Further, the invention embraces configurations which are similar to the configurations described in any one of the above embodiments except that a well-known technique is added.

The invention claimed is:

1. A method of supporting a sample in a transmission electron microscope, said method comprising the steps of:
   forming a first layer on a first surface of a substrate;
   etching a second surface of the substrate that faces away from the first surface to form an opening in the substrate which exposes the first layer;
   forming a second layer on the surface of the first layer away from said opening in the substrate, said second layer having a lower etching rate than the first layer;
   removing a region of the first layer that overlaps the opening in the substrate by etching via the opening to expose the second layer to leave an electron beam path from the second layer through the opening of the substrate substantially free of foreign matter so as to not affect observation of the transmission electron microscope image;
   forming an electrically conductive layer on a region of said second layer that has been exposed by the step of exposing the second layer; and
   supporting a sample in an electron microscope on the first layer.

2. A method as set forth in claim 1, wherein during the step of forming said second layer, the second layer is formed by vacuum evaporation, sputtering, ion plating, or CVD.

3. A method as set forth in claim 1, further including the steps of:
   forming a third layer on said second layer; and
   removing a region of the second layer that overlaps said opening as viewed within a plane to expose the third layer.

4. A method as set forth in claim 1, wherein said first layer is made of silicon nitride.

5. A method as set forth in claim 1, wherein said second layer is made of chromium, IGZO, or tantalum.

6. A method as set forth in claim 1, wherein said substrate is a silicon substrate.

7. A method as set forth in claim 1, wherein said opening has a two-dimensional shape consisting of a rectangle having short and long sides.

8. A method as set forth in claim 3, wherein during the step of forming said third layer, the third layer is formed by vacuum evaporation, sputtering, ion plating, or CVD.

9. A method of supporting a sample in a transmission electron microscope, said method comprising the steps of:
   forming a first layer on a first surface of a substrate;
   forming a second layer on the surface of the first layer said second layer having a lower etching rate than the first layer;
   etching the first layer and a second surface of the substrate that faces away from the first surface to form an opening which exposes the second layer to leave an electron beam path from the first surface to the second surface of the substrate substantially free of foreign matter so as not to affect observation of the transmission electron microscope image;
   forming an electrically conductive layer on a region of said second layer that has been exposed by the step of forming said opening which does not affect observation of the transmission electron microscope image; and
   supporting a sample in an electron microscope on the first layer.

10. A method as set forth in claim 9, wherein during the step of forming said second layer, the second layer is formed by vacuum evaporation, sputtering, ion plating, or CVD.

11. A method as set forth in claim 9, further including the steps of:
   forming a third layer on said second layer; and
   removing a region of the second layer that overlaps said opening as viewed within a plane to expose the third layer.

12. A method as set forth in claim 11, wherein during the step of forming said third layer, the third layer is formed by vacuum evaporation, sputtering, ion plating, or CVD.

13. A method of supporting a sample in a transmission electron microscope, said method comprising the steps of:
   forming a recess in a first surface of a substrate;
   forming a first layer on a second surface of the substrate that faces away from the first surface;
   etching a bottom surface of the recess to form an opening that exposes the first layer leaving an electron beam path through the first layer substantially free of foreign matter so as to not affect observation of the transmission electron microscope image;
   forming an electrically conductive layer on a region of said first layer that has been exposed by the step of forming said opening which does not affect observation of the transmission electron microscope image; and
   supporting a sample in an electron microscope on the first layer.

14. A method as set forth in claim 13, wherein during the step of forming said first layer, the first layer is formed by vacuum evaporation, sputtering, ion plating, or CVD.

15. A method as set forth in claim 13, wherein during the step of forming said opening, the etching of the bottom surface of said recess is carried out by dry etching using XeF2 gas.

* * * * *